(12) United States Patent
Lei

(10) Patent No.: US 7,680,619 B1
(45) Date of Patent: Mar. 16, 2010

(54) PARALLEL TEST ARCHITECTURE

(75) Inventor: Miao Lei, Beijing (CN)

(73) Assignee: Keithley Instruments, Inc., Cleveland, OH (US)

( * ) Notice: Subject to any disclaimer, the term of this patent is extended or adjusted under 35 U.S.C. 154(b) by 0 days.

(21) Appl. No.: 11/141,451

(22) Filed: May 31, 2005

(51) Int. Cl.
*G06F 13/14* (2006.01)

(52) U.S. Cl. .................................. 702/108

(58) Field of Classification Search ............... 702/108; 356/72
See application file for complete search history.

(56) References Cited

U.S. PATENT DOCUMENTS 6,507,203 B1 * 1/2003 Hirschmann ............... 324/754
2002/0041538 A1 * 4/2002 Hayashi ..................... 368/121

OTHER PUBLICATIONS http://www.m-w.com/dictionary/queue, p. 1.*
http://209.161.33.50/dictionary/computer, p. 1.*
http://209.161.33.50/dictionary/queue, p. 1.*
http://209.161.33.50/dictionary/phase, p. 1.*
http://en.wikipedia.org/wiki/DRAM, p. 1-9.*
Marius V.A. Hancu, A Concurrent Test Architecture for Massively Parallel Computers and Its Error Detection Capability, IEEE 1994, p. 1169-1184.*

* cited by examiner

*Primary Examiner*—Tung S Lau
(74) *Attorney, Agent, or Firm*—Pearne & Gordon LLP

(57) ABSTRACT

A measurement system for testing a DUT includes a plurality of procedures for performing test functions, each procedure having a phase variable; a task queue where the procedures are entered in the task queue with a sign-up value of the phase variable; and a multiphase task executor that arranges the procedures in the queue in response to the sign-up value. The executor changes the phase variable to an execution value and executes the procedures in the task queue after the phase variable has the execution value.

3 Claims, 1 Drawing Sheet

PARALLEL TEST ARCHITECTURE

BACKGROUND OF THE INVENTION

The present invention is related to the automatic testing of electrical materials, components and circuits and, in particular, to an architecture for a test system.

Automatic testing of electrical materials, components and circuits has become pervasive. In many cases, every device is tested and, in general, many more are tested than in the past and more types of tests are made. In order to more efficiently make measurements on a device under test (DUT), performing multiple tests simultaneously (i.e., in parallel) has become desirable.

There are typically a number of procedures to be executed. These procedures may be dynamic. Some procedures may require some others to be finished first, or cooperate together to complete an action in maximum efficiency, or conflict with some others. Therefore, they should not run immediately when they get into the processor. They may need to wait until sufficient procedures are known, and then get executed in proper combinations and sequence.

This may require that a procedure be held and then run in the future. In addition, resource conflicts should be avoided and result integrity needs to be maintained.

Traditional parametric tests are sequential tests, which connect and measure one device at one time. Parallel tests allows multiple instruments to connect with multiple devices, force signals and measure responses of the devices at the same time, or, in parallel. This technique is extremely useful when throughput of a production line is critical. However, since these devices may be interconnected, they may interact with each other. Therefore, some test procedures should avoid running in parallel with interacting ones. On the other hand, some tests prefer to run in parallel with those dealing with isolated devices. Since different products have different device interconnections, the best combinations of the devices are numerous.

This brings a fundamental problem: How to program the parallel test functions for these various combinations? The brute force method would be writing functions for all possibilities: one resistor in parallel with one transistor, two resistors and one transistor, one resistor and two transistors, four transistors, eight resistors, etc. However, the number of combinations is huge. If there are tens (which is typical) of individual parameter test algorithms, it is essentially impossible to cover all possible cases.

SUMMARY OF THE INVENTION

A measurement system for testing a DUT includes a plurality of procedures for performing test functions, each procedure having a phase variable; a task queue where the procedures are entered in the task queue with a sign-up value of the phase variable; and a multiphase task executor that arranges the procedures in the queue in response to the sign-up value. The executor changes the phase variable to an execution value and executes the procedures in the task queue after the phase variable has the execution value.

DESCRIPTION OF AN EMBODIMENT

Figure 1:
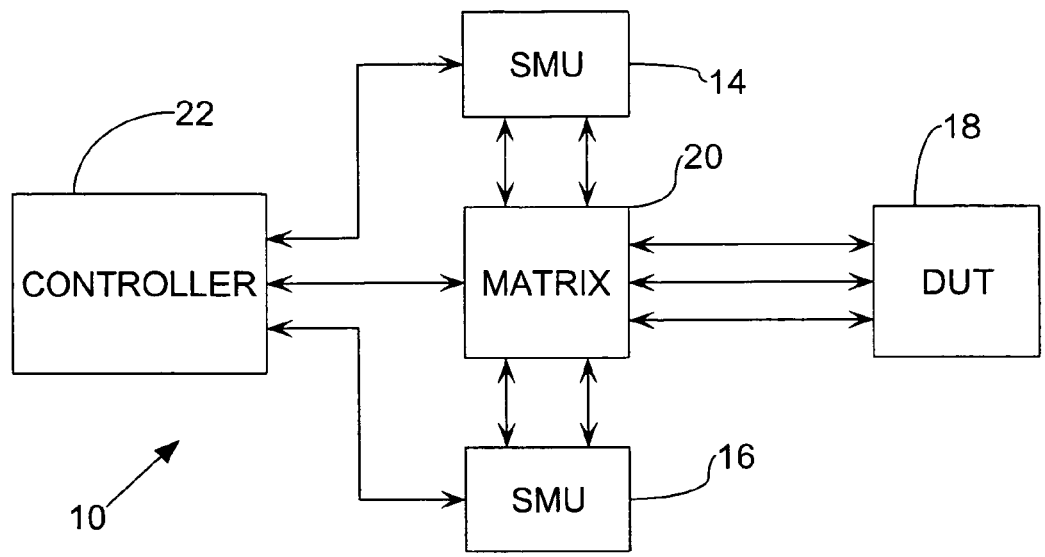
FIG. 1 is block diagram of an example of a system according to the invention.

Referring to FIG. 1, a measurement system 10 includes measurement devices 14, 16 connectable to a DUT 18. In this example, the connections are made through a switching matrix 20. The matrix 20 is controlled by a test controller 22, which also controls the operation of the devices 14, 16.

Under control of the controller 22, the matrix 20 selects which of the test lines 24, 26, 28, 30 are connected to the devices 14, 16.

The controller 22 may include, for example, a pc computer, or other microprocessor-controlled, or the like, programmable device.

Figure 2:
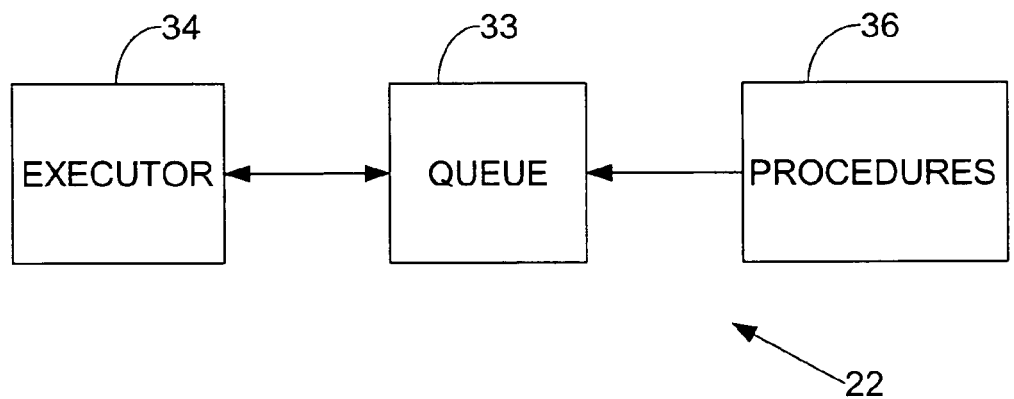
FIG. 2 is block diagram of an example of a detail of an example of a system according to the invention.

Referring to FIG. 2, the controller 22 is configured to include an architecture including a task queue 32 and a multiphase task executor 34. Test procedures 36 are entered in the queue 32 and executed by the executor 34.

Each procedure 36 has a phase variable associated with it. The phase variable may take on two or more values. The first value is a sign-up value and the second, or greater values, are execution values. For example, the sign-up value may be 0 and the execution values may be 1, 2, 3 and 4.

When a task or procedure enters the controller 22, its phase variable is set to 0 and the procedure is entered into the task queue 32. When the executor 34 accesses the procedure the first time it recognizes the sign-up value and, rather than executing the procedure, the executor examines the procedure, analyzes the procedure's requirements in comparison with other procedures in the queue 32 and arranges the procedure in the queue 32 for at least non-interfering execution and for parallel execution when possible. The phase variable is then changed to 1.

The next time the executor 34 accesses the procedure, it is executed. In many cases, the procedure may have more than one execution phase value. This allows different portions of the procedure to be performed at different times. For example, a group of procedures may have a phase value of 1 indicating each procedure should instruct the matrix 20 to connect the devices 14, 16 to the DUT 18 in some manner. The executor then changes the execution phase value to 2 indicating that the devices 14, 16 should then preform the desired tests on the DUT 18.

When a procedure runs, the phase variable is evaluated first. If the phase variable equals 0, then it does not execute its main instructions and contexts. The procedure includes information such as the name and/or address of this procedure, the arguments passed in, and the properties of the procedure, for example, hardware resource requirement, dependencies on other procedures, etc.

Once enough procedures have been signed up, or the queue 32 is explicitly requested to run, then the executor 34 is invoked to process the queue 32 and execute the procedures.

There may be "enough" procedures, for example, when there is at least one set of procedures, which is adequate to perform a standalone action, and it has no dependencies to any other procedures.

First, the executor 34 retrieves the information of each procedure, and then sorts the execution sequence, groups the procedures, or discards invalid procedures, or performs whatever actions to the task queue, according to the properties these procedures and the rules of the execution identity. The algorithm that the task executor processes the task queue varies from application to application.

After the task queue 32 is validated and/or adjusted, the executor 34 sets the phase variable to a non-zero value, and re-calls the procedures associated with the procedures one by one, or by groups concurrently. When a procedure is reentered with the phase set to non-zero value, it will skip the sign-up branch and go through the main code.

The phase, at which procedure's main code is executed, is called the "run phase".

The simplest application may contain only one run phase. In advanced applications, more than two run phases may be used. For example, in device test applications, all the measurement devices must get connected to the DUTs before any forcing and measuring actions happen. In this case, two run phases should exist in each procedure. In run phase 1, the measurement devices get connected. In run phase 2, the measurement devices force signals and measure device responses. The task executor 34 will go through each procedure's phase 1 codes, then phase 2 codes, and the actions will be:

Run phase 1: procedure 1 makes connection
Run phase 1: procedure 2 makes connection
Run phase 1: procedure 3 makes connection
Run phase 2: procedure 1 takes measurement
Run phase 2: procedure 2 takes measurement
Run phase 2: procedure 3 takes measurement.

For example, each procedure may be entered for up to four times, and each time it gets reentered, it executes a different part of itself.

After the task queue 32 execution is completed, the task executor 34 resets the phase to 0, so that upcoming procedures can continue to sign up. The executed procedures may or may not be cleared, depending on the application.

To properly allocate resources, that is, to allocate resources that are sufficient to accommodate the procedures, and to prevent mutual exclusion resource from being accessed by multiple procedures concurrently, the resource usage of each procedure is known by the executor 34, before they are executed. The algorithm is to declare the resource requirement in the sign-up phase, and to use the resource in the run phases. To ensure that the resources declared match the resources actually used, the resource declaration and allocation codes are usually merged in one function. When this function is called at the sign-up phase, it increases the counter of the requested resource. When called at run phases, it returns the actual resource. For example, such resource allocating function can be used as:

rsc=*mpx*_resource( );

Where rsc is the resource handle. When this statement is executed at the sign-up phase, rsc does not get a usable resource handle at all. Instead, the mpx_resource function increases the counter of the requested resource of this procedure. When this statement is executed at run phases, the mpx_resource function returns an actual resource handle to rsc, so the procedure can use this handle to access the system.

Resource conflict is defined as: If resources requested by more than one procedures exceed what the system actually has available, or if a non-shareable resource is requested by more than one procedures, then these procedures conflict.

To avoid resource conflict, the executor 34 maintains a table of the system resource allocation. When a resource is requested by a procedure, such as an instrument, a serial port, or a segment of memory, etc., the executor 34 knows where it goes and which procedure it belongs to. The system does not allow conflicting procedures to run concurrently.

The execution of the procedures can be optimized. This is especially true when the procedures are running in a concurrent environment. By putting as many compatible (non-conflicting) procedures together as possible and running them concurrently, in other words, by dividing the procedures into the smallest possible number of groups, the procedures can run at the maximum efficiency.

A greedy algorithm is used to group the procedures. The greedy algorithm to group all procedures can be described as below:

1. A buffer contains the first procedure only.
2. Look through the other procedures for one that does not conflict with any procedure in the buffer.
3. If found, merge the new procedure into the buffer.
4. If not found, log the current buffer as a newly-built group, clear the buffer, and move the first unprocessed procedure into the buffer.
5. If there are unprocessed procedures, then repeat step 2.
6. End.

The greedy algorithm is a time-consuming algorithm. An optimized method splits the greedy algorithm into pieces, and takes advantage of the concurrent environment. Instead of completing all the procedures, the optimized algorithm makes one group only:

1. A buffer contains the first procedure only.
2. Look through the other procedures for one that does not conflict with any procedure in the buffer.
3. If found, merge the new procedure into the buffer, and repeat 2.
4. If not found, end.

As soon as the first group is ready, the executor 34 can run them. When these procedures are running, the executor 34 can call the optimized greedy algorithm to prepare the next group. With this method, the time costs of sorting and grouping are overlapped by the procedure execution.

Programming Example

The program shown below is written in pseudo-C style. The data structure of the task queue:

```
struct task_queue {
    char *func_name;
    void (*func_pointer) (void *);
    void *arguments;
    int property1;
    int property2;
        :
        :
    int propertyN;
    struct task_queue    *next;
};
A sample procedure code:
void procsample(int arg1, int arg2, double arg3, .)
{
    if (phase == 0) {      // signup phase
        sign up(procsample, &arg1, &arg2, &arg3, .);
        // Other properties declarations
        return;
    }
    if (phase == 1) {      // run phase
        // main codes of procsample here
        :
        :
        :
    }
    // May have more than one run phases
    if (phase == 2) {
        // codes of run phase 2 here
        :
        :
        :
}
    :
    :
    :
```

-continued

```
        if (phase == N) {
            // codes of run phase N here
            :
            :
            :
        }
    }
```

For security reasons, the phase evaluation expression in the sample code above should be replaced by functions, so that the phase variable is read-only to the procedures. Macros may also be defined to allow better readability, for example:

```
#define    SIGNUP_PHASE      if (phase == 0)
#define    RUN_PHASE         if (phase == 1)
#define    RUN_PHASE_N       if (phase == N)
```

Sample sign up function and executor codes are as below. The adjustment to the task queue is omitted:

```
void sign_up((void *)func( ), void *args, .)
{
    task=malloc(sizeof(struct task_queue));
    task→func_pointer=func;
    task→arguments=args;
    if (task_head==NULL)
        task_head=task;
else
    task_tail→next task;

task_tail=task;

}
void executor(void)
{
    // Adjusting the task queue has been done prior to this point.
    for (phase=1; phase <N; phase++) {
        for (task=task_head; task !=NULL; task=task→next)
            task→func_pointer(task→arguments);
    }
    phase=0;
}
```

The present invention provides a systematic and efficient architecture for a measurement system that can make effective use of parallel testing advantages.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A measurement system for testing a DUT, said system comprising:
   a plurality of computer procedures for performing test functions, each procedure having a phase variable;
   a computer task queue, said procedures being entered in said task queue with a sign-up value of said phase variable;
   a multiphase task executor, said executor arranging said procedures in said queue in response to said sign-up value, changing said phase variable to an execution value and executing said procedures in said task queue after said phase variable has the execution value, wherein said procedures may be executed in parallel.

2. A system according to claim 1, wherein said phase variable has up to four execution values, a different portion of the procedure being performed for each execution value.

3. A system according to claim 2, wherein there is a connection execution value and a measurement execution value, the procedure connecting to the DUT in response to the connection execution value and the procedure making a measurement on the DUT in response to the measurement execution value.

* * * * *